United States Patent
Fan (10) Patent No.: US 11,721,382 B2
(45) Date of Patent: Aug. 8, 2023

(54) REFRESH CIRCUIT AND MEMORY

(71) Applicant: CHANGXIN MEMORY TECHNOLOGIES, INC., Anhui (CN)

(72) Inventor: Xian Fan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 40 days.

(21) Appl. No.: 17/650,516

(22) Filed: Feb. 9, 2022

(65) Prior Publication Data

US 2022/0270669 A1 Aug. 25, 2022

Related U.S. Application Data

(63) Continuation of application No. PCT/CN2021/112877, filed on Aug. 16, 2021.

(30) Foreign Application Priority Data

Nov. 4, 2020 (CN) .......................... 202011217665.X (51) Int. Cl.
*G11C 11/406* (2006.01)
*G11C 7/10* (2006.01)
*G11C 11/408* (2006.01)
*G11C 11/4096* (2006.01)
*G11C 29/00* (2006.01)

(52) U.S. Cl.
CPC ...... *G11C 11/40611* (2013.01); *G11C 7/1039* (2013.01); *G11C 11/4085* (2013.01); *G11C 11/4096* (2013.01); *G11C 29/785* (2013.01)

(58) Field of Classification Search
CPC ................................................ G11C 11/40611

USPC .......................................................... 365/222
See application file for complete search history.

(56) References Cited

U.S. PATENT DOCUMENTS 9,311,984 B1 * 4/2016 Hong ..................... G11C 11/406
9,627,032 B2 4/2017 Jung et al.
9,640,241 B2 * 5/2017 Jung .................. G11C 11/40611
(Continued)

FOREIGN PATENT DOCUMENTS

CN 105304118 A 2/2016
CN 105825883 A 8/2016
(Continued)

*Primary Examiner* — Anthan Tran
(74) *Attorney, Agent, or Firm* — Syncoda LLC; Feng Ma (57) ABSTRACT

A refresh circuit includes signal selector configured to select one of normal and redundant word line logical addresses as output, output signal of which is designated as first logical address; row address latch connected to output terminal of signal selector and configured to output row hammer address and row hammer flag signal according to first logical address; seed arithmetic unit connected to output terminal of row address latch and configured to generate seed address according to row hammer address; logical arithmetic unit connected to output terminal of seed arithmetic unit and configured to obtain row hammer refresh address according to seed address, row hammer refresh address is adjacent physical address of seed address; and pre-decode unit connected to output terminal of logical arithmetic unit and configured to receive row hammer refresh address, and convert it into physical address to be used by memory array of memory to perform refresh operation.

18 Claims, 3 Drawing Sheets

(56) References Cited

U.S. PATENT DOCUMENTS

2016/0019944 A1   1/2016   Jung et al.
2016/0086649 A1   3/2016   Hong et al.
2016/0351248 A1  12/2016   Jung
2019/0237132 A1*  8/2019   Morohashi ............. G11C 29/70

FOREIGN PATENT DOCUMENTS

CN    106205672 A   12/2016
CN    111164699 A    5/2020

* cited by examiner

REFRESH CIRCUIT AND MEMORY

CROSS-REFERENCE TO RELATED APPLICATIONS

This is a continuation of International Application No. PCT/CN2021/112877 filed on Aug. 16, 2021, which claims priority to Chinese Patent Application No. 202011217665.X filed on Nov. 4, 2020. The disclosures of these applications are hereby incorporated by reference in their entirety.

BACKGROUND

As the density of semiconductor storage devices continues to increase, memory cells exhibit the characteristics of shrinking physical volume, reduced stored charge, and reduced noise tolerance. The electromagnetic interaction between the memory cells has an increased impact on the memory cells, and the possibility of data loss in the memory cell increases.

SUMMARY

Embodiments of the disclosure relate to but are not limited to a refresh circuit and a memory.

In order to solve the above-mentioned problem, embodiments of the disclosure provide a refresh circuit, which includes a signal selector configured to select one of a normal word line logical address and a redundant word line logical address to be an output, an output signal of which is designated as a first logical address; a row address latch, connected to an output terminal of the signal selector and configured to output a row hammer address and a row hammer flag signal according to the first logical address; a seed arithmetic unit, connected to an output terminal of the row address latch and configured to receive a refresh signal as an excitation signal and generate a seed address according to the row hammer address; a logical arithmetic unit, connected to an output terminal of the seed arithmetic unit and configured to obtain a row hammer refresh address according to the seed address, the row hammer refresh address is an adjacent physical address of the seed address; and a pre-decode unit, connected to an output terminal of the logical arithmetic unit and configured to receive the row hammer refresh address, and convert the row hammer refresh address into a physical address to be used by a memory array of a memory to perform a refresh operation.

According to embodiments of the disclosure, the embodiments of the disclosure further provide a memory including a memory array and a refresh circuit. The circuit includes: a signal selector, configured to select one of a normal word line logical address and a redundant word line logical address as an output, an output signal of which is designated as a first logical address; a row address latch, connected to an output terminal of the signal selector and configured to output a row hammer address and a row hammer flag signal according to the first logical address; a seed arithmetic unit, connected to an output terminal of the row address latch and configured to receive a refresh signal as an excitation signal and generate a seed address according to the row hammer address; a logical arithmetic unit, connected to an output terminal of the seed arithmetic unit and configured to obtain a row hammer refresh address according to the seed address, wherein the row hammer refresh address is an adjacent physical address of the seed address; and a pre-decode unit, connected to an output terminal of the logical arithmetic unit and configured to receive the row hammer refresh address, and convert the row hammer refresh address into a physical address to be used by the memory array of the memory to perform a refresh operation.

BRIEF DESCRIPTION OF THE DRAWINGS

One or more embodiments are exemplarily illustrated by the corresponding drawings. These exemplary descriptions do not limit the embodiments, and elements with the same reference numbers in the drawings are designated as similar elements. Unless otherwise stated, the pictures in the drawings do not limit the scale.

DETAILED DESCRIPTION

When a specific word line (typically referred to as an "aggressor" word line) in the memory cell is read and written frequently, it may cause the discharge rate of a capacitor of an adjacent word line (typically referred to as a "victim" word line) to be higher than a natural discharge rate, thereby leading to occurrence of data loss in the adjacent word line due to excessive charge loss before a refresh signal arrives. This condition will be typically referred to as "row hammer effect".

In a memory, after a refresh signal arrives, all of normal word lines are refreshed firstly and then redundant word lines are intensively refreshed. Such a refresh mode exhibits appreciable hysteresis and thus cannot timely and effectively protect a word line adjacent to the word line that is frequently accessed during an access process.

In order to solve the above-mentioned problem, embodiments of the disclosure provide a refresh circuit and a memory, which may output a row hammer address and a row hammer flag signal according to an input first logical address, that is, according to the input first logical address, the refresh sequence of the row hammer refresh address and the memory array is adjusted in real time. When a victim word line is refreshed, the redundant word line and the normal word line are not distinguished, so that the word line adjacent to the word line that is frequently accessed are refreshed timely to ensure the accuracy of data storage of the memory array.

In order to make the objectives, technical solutions, and advantages of the embodiments of the disclosure clearer, each embodiment of the disclosure will be described below in detail in combination with the drawings. However, one of ordinary skill in the art may understand that, in each embodiment of the disclosure, many technical details are proposed to make readers understand the disclosure better. However, the technical solutions claimed by the disclosure may also be implemented even without these technical details and various variations and modifications made based on each of the following embodiments.

Figure 1:
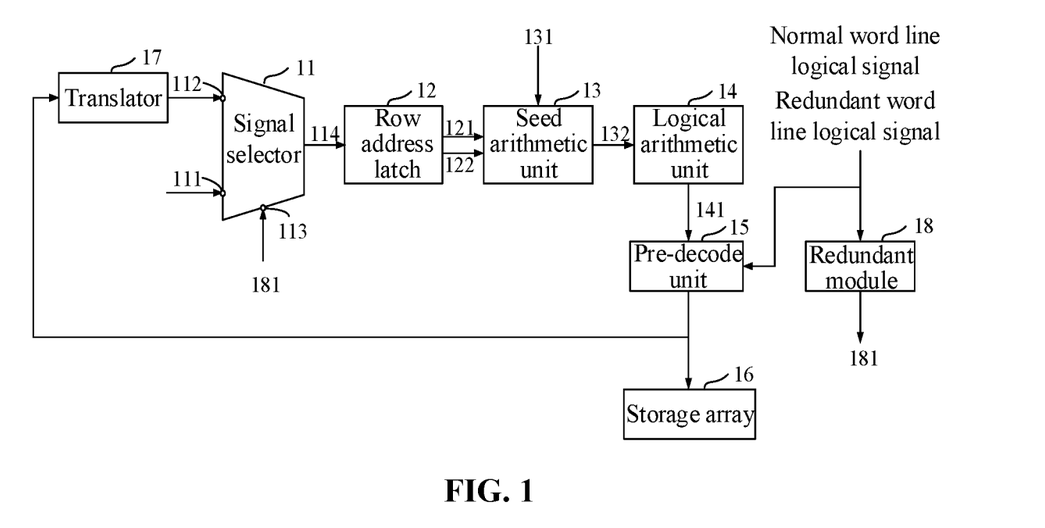
FIG. 1 is a schematic diagram showing a functional structure of a refresh circuit according to an embodiment of the present disclosure.

FIG. 1 is a schematic diagram showing a functional structure of a refresh circuit according to an embodiment of the present disclosure.

Referring to FIG. 1, the refresh circuit includes: a signal selector 11 configured to select one of a normal word line logical address and a redundant word line logical address as an output, an output signal of which is designated as a first logical address 114; a row address latch 12, connected to an output terminal of the signal selector 11 and configured to output a row hammer address 121 and a row hammer flag signal 122 according to the first logical address 114; a seed arithmetic unit 13, connected to an output terminal of the row address latch 12 and configured to receive a refresh signal 131 as an excitation signal and generate a seed address 132 according to the row hammer address 121; a logical arithmetic unit 14, connected to an output terminal of the seed arithmetic unit 13 and configured to obtain a row hammer refresh address 141 according to the seed address 132, the row hammer refresh address 141 is an adjacent physical address of the seed address 132; and a pre-decode unit 15, connected to an output terminal of the logical arithmetic unit 14 and configured to receive the row hammer refresh address 141, and convert the row hammer refresh address 141 into a physical address to be used by a memory array of a memory to perform a refresh operation. Herein, each of the seed arithmetic unit and the logical arithmetic unit may include an arithmetic and logic unit, an accumulator and registers; and the pre-decode unit may be a pre-decoder.

In the embodiment, the signal selector 11 includes a first input terminal 111 and a second input terminal 112. The first input terminal 111 is configured to receive the normal word line logical address and the second input terminal 112 is configured to receive the redundant word line logical address.

In the embodiment, the signal selector 11 further includes a third input terminal 113 for receiving a redundant flag signal 181, and the signal selector 11 is further configured to enable one of the first input terminal 111 and the second input terminal 112 according to the redundant flag signal 181.

In the embodiment, the refresh circuit further includes a translator 17 having an output terminal connected to the second input terminal 112, and configured to convert the physical address into the redundant word line logical address.

In the embodiment, the pre-decode unit 15 is further configured to receive the redundant word line logical address, and send the physical address corresponding to the redundant word line logical address to the translator 17 and the memory array 16 for the memory array 16 to perform the refresh operation. The refresh circuit also includes a redundant module 18 configured to output the redundant flag signal 181 after receiving the redundant word line logical address.

In the embodiment, the pre-decode unit 15 is further configured to receive the normal word line logical address and the redundant word line logical address, and convert the normal word line logical address and the redundant word line logical address into the physical addresses to be used by the memory array 16 to perform the refresh operation.

In the embodiment, the refresh circuit is configured to receive a read/write signal and the refresh signal 131 in sequence, and the pre-decode unit 15 is further configured to send the physical address to the memory array 16 after the read/write signal is received.

In the embodiment, the first logical address 114 whose cumulative number of accesses is greater than a preset number of times is designated as the row hammer address 121, the row address latch 12 is configured to output the row hammer address 121 and the row hammer flag signal 122 after the row hammer address 121 is obtained.

Furthermore, the row address latch 12 is further configured to, after a plurality of first logical addresses each having a cumulative number of accesses greater than the preset number of times are obtained, determine the first logical address 114 having a greatest cumulative number of accesses as the row hammer address 121.

In the embodiments, the refresh circuit alternatively receives the read/write signal and the refresh signal to alternatively perform a read/write operation and the refresh operation for the physical address. The refresh circuit keeps receiving the read/write signals during a period of time to keep performing the read/write operation on the memory array within the period of time so as to implement data storage; and the refresh circuit keeps receiving the refresh signals within another period of time after the period of time to keep performing the refresh operation on the memory array so as to ensure the accuracy of data storage. For ease of description, the period of time of receiving the read/write signals is designated as a read/write phase, and the period of time of receiving the refresh signals is designated as a refresh phase below.

In the read/write phase, the refresh circuit receives the logical address while receiving the read/write signal, the logical address corresponds to the physical address that requires the read/write operation, the refresh circuit accumulates the received logical addresses while converting the logical address into the physical address for the memory array 16 to perform read/write operation, and determines, according a cumulative result, whether or not it is aggressed, and when it is aggressed, the logical address of an aggressor word line is obtain. The refresh circuit starts waiting to receive the refresh signals after stopping receiving the read/write signals. After entering in the refresh phase, the refresh circuit sends, according to the cumulative result, the physical address to be refreshed to the memory array 16 to prevent the physical address to be refreshed from being affected by the row hammer effect, thereby ensuring that the memory array 16 has good accuracy of data storage.

Specific working principles of the refresh circuit in the read/write phase and the refresh phase will be specifically described below.

In the embodiment, the pre-decode unit 15 receives the accessed normal word line logical address and the redundant word line logical address while receiving the read/write signal, and converts the received logical addresses into the physical addresses for the read/write operation performed by the memory array 16. The memory array 16 performs read/write operation on a memory cell according to the physical address to implement data storage.

In the embodiment, the redundant module 18 also starts receiving the accessed normal word line logical address and the redundant word line logical address after receiving the read/write signal and generates the redundant flag signal 181 after receiving the redundant word line logical address, the redundant flag signal 181 is subsequently sent to the signal selector 11 to selectively enable the input terminal.

In the embodiment, the pre-decode unit 15 and the redundant module 18 have a same signal source. The redundant module 18 receives both the redundant word line logical address as well as the normal word line logical address. In other embodiments, the pre-decode unit and the redundant module have different signal sources, and the redundant module only receives the redundant word line logical address. Only receiving the redundant word line logical address means that the signal source sends the redundant word line logical address to the redundant module 18 after confirming that the current read/write logical address in a series of to-be-read/write logical addresses is the redundant word line logical address.

In the embodiment, the pre-decode unit 15 further sends the physical address corresponding to the redundant word line logical address to the translator 17 while sending the physical address corresponding to the redundant word line logical address to the memory array 16. In the embodiment, the signal selector 11 is configured to receive the accessed normal word line logical address and the redundant word line logical address, the logical address corresponds to the word line physical address on which the read/write operation is performed in the memory array 16. As such, the number of times of the read/write operation performed on a certain word line physical address in the memory array 16 may be obtained so that according to the number of times of the read/write operation performed, it is determined whether or not any word line is aggressed, and the logical address of the aggressor word line is obtained to accurately obtain the physical address of the word line adjacent to the aggressor word line. After the refresh signal arrives, the pre-decode unit 15 sends the physical address of the adjacent word line to the memory array 16 for the memory array 16 to perform the refresh operation.

In the embodiment, the first input terminal 111 is configured to receive the normal word line logical address, the second input terminal 112 is configured to receive the redundant word line logical address, and the redundant word line logical address received by the second input terminal 112 is translated from the translator 17. In another embodiment, the refresh circuit may further exclude the translator, and the second input terminal receives the redundant word line logical address from other signal sources.

In the embodiment, when the redundant module 18 receives the normal word line logical address pointing to the normal word line, the redundant flag signal 181 is not sent out, or another flag signal distinguishable from the redundant flag signal 181 is sent out, at this time the first input terminal 111 is enabled and the second input terminal 112 is disabled; when the redundant module 18 receives the redundant word line logical address pointing to the redundant word line, the redundant flag signal 181 is sent out, at this time the first input terminal 111 is disabled and the second input terminal 112 is enabled.

Since the redundant module 18 and the pre-decode unit 15 have the same signal source, when the redundant module 18 sends out the redundant flag signal 181, the signal selector 11 receives the redundant word line logical address translated and output by the translator 17, at this time the second input terminal 112 is enabled, the signal selector 11 outputs the received redundant word line logical address as the first logical address 114; when the redundant module 18 does not send out the redundant flag signal 181, the signal selector 11 receives the normal word line logical address pointing to the normal word line, at this time the first input terminal 111 is enabled, the normal word line logical address is output as the first logical address 114.

It is to be noted that when the redundant module and the pre-decode unit have different signal sources, it is necessary to control timing so that the redundant module and the pre-decode unit receive the normal word line logical address or the redundant word line logical address simultaneously.

In the embodiment, the row address latch 12 latches the first logical address 114 after receiving it, to accumulate the number of accesses to different first logical addresses 114 or the number of read/write operations on different first logical addresses 114 during the read/write phase.

In the embodiment, when the cumulative number of accesses of each of the first logical addresses 114 in the first logical addresses 114 latched by the row address latch 12 is less than or equal to the preset number of times, the current first logical addresses 114 received in real time are output, and another flag signal distinguishable from the row hammer flag signal 122 is output to indicate that the memory array 16 is not "aggressed", that is, the refresh operation is not needed to be performed on a word line adjacent to a certain word line for suppressing the "row hammer effect". The seed arithmetic unit 13 does not generate the seed address 132, the logical arithmetic unit 14 does not output the row hammer refresh address 141 to the pre-decode unit 15, the row hammer refresh address 141 is the logical address adjacent to the row hammer address 121.

Correspondingly, when the cumulative number of accesses of any of the first logical addresses 114 is greater than the preset number of times, the row address latch 12 sends the first logical address 114 whose cumulative number of accesses is greater than the preset number of times as the row hammer address 121 to the seed arithmetic unit 13 and simultaneously outputs the row hammer flag signal 122 to indicate that the row hammer address 121 in the memory array 16 is aggressed.

After the refresh signal 131 is received, the seed arithmetic unit 13 generates, according to the row hammer address 121, the seed address 132, and sends the seed address 132 to the logical arithmetic unit 14 to obtain the row hammer refresh address 141, the memory array 16 may refresh the physical address pointed by the row hammer refresh address 141 so as to prevent the word line adjacent to the aggressor word line from being affected by the "row hammer effect" to ensure data accuracy of the memory array 16. It is to be noted that it is assumed that the first logical address 114 includes both a logical address A and a logical address B, when the cumulative number of accesses of A is greater than the preset number of times, A is used as the row hammer address 121, and the row address latch 12 keeps outputting A; when the cumulative number of accesses of B is greater than the preset number of times and less than the cumulative number of accesses of A, A is still used as the row hammer address 121; when the cumulative number of accesses of B is greater than that of A, B instead of A is used as the new row hammer address 121, at this time the row address latch 12 keeps outputting the row hammer signal 121 which is essentially B. That is to say, after the cumulative number of accesses of any one of the first logical addresses 114 is greater than the preset number of times, the row address latch 12 keeps outputting the first logical address 114 having a greatest cumulative number of accesses.

In another embodiment, when there are multiple the first logical addresses whose cumulative numbers of accesses are greater than the preset number of times in the row address latch, the seed arithmetic unit may further send a feedback to the row address latch after generating the seed address and sending the seed address to the logical arithmetic unit so that the row address latch may use the first logical address having a second greatest cumulative number of accesses as the new row hammer address. As such, in the refresh phase, the word lines adjacent to all of the aggressor word lines in the memory array may be refreshed firstly and refreshed successively according to the degree of influence, which is conducive to timely suppressing the influence of the "row hammer effect" to ensure data accuracy of the memory array.

The setting of the preset number of times may be adjusted according to the actual situation, such as according to an aggression limit accepted by a user, that is, if the cumulative number of accesses of the word line exceeds the aggression limit, the word line is assumed to be aggressed; it may further be determined according to the performance of a capacitor, when the capacitor may discharge current for a long time without losing data, the preset number of times may be set to a higher value.

In the embodiment, the preset number of times is 500, that is, when the number of times a certain physical row address is accessed exceeds 500, the physical row address is assumed to be aggressed.

In the embodiment, the logical arithmetic unit 14 determines, by default, a +1 physical address and a −1 physical address that are adjacent to the seed address 132 as the row hammer refresh addresses 141, or defaults the +1 physical address, the −1 physical address, a +2 physical address, and a −2 physical address as the row hammer refresh addresses 141. In another embodiment, the preset number of times at least includes a first preset number of times and a second present number of times, when the cumulative number of accesses is greater than the first preset number of times but less than the second preset number of times, the row hammer refresh addresses are the +1 physical address and the −1 physical address adjacent to the seed address, when the cumulative number of accesses is greater than or equal to the second preset number of times, the row hammer refresh addresses are the +2 physical address, the +1 physical address, the −1 physical address, and the −2 physical address adjacent to the seed address. That is to say, compared with the seed address 132, an adjacent range of the row hammer refresh address 141 may be adjusted according to the cumulative number of accesses to ensure that the adjacent word line influenced by the row hammer effect may be refreshed timely. The seed address herein may be functionally understood as a base address corresponding to the logical address, the +1 physical address, the −1 physical address, the +2 physical address, and the −2 physical address herein may be understood that the base address is offset in an upward direction by 1 address, the base address is offset in an downward direction by 1 address, the base address is offset in an upward direction by 2 addresses, the base address is offset in an downward direction by 2 addresses.

Specifically, when the normal word line in the memory array 16 is in an enable state or no damage occurs, the memory array 16 only performs read/write operation on the normal word line, when the normal word line is aggressed, the refresh circuit sends, after the refresh signal arrives, the physical address of the word line adjacent to the normal word line to the memory array 16 for the memory array 16 to perform the refresh operation.

Figure 2:
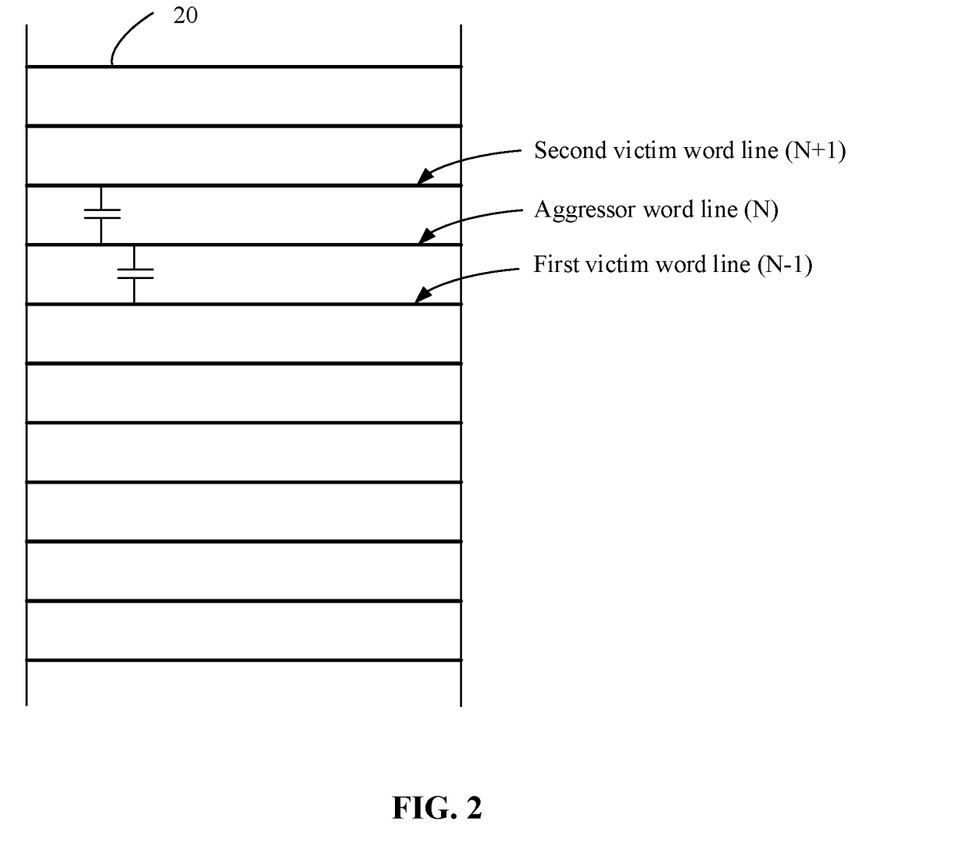
FIG. 2 is a first schematic diagram of word lines according to an embodiment of the present disclosure.

Referring to FIG. 2, multiple word lines 20 are contained in the memory array, the base address of the aggressor word line is N, one unit offset in a downward direction is a base address N−1 of a first victim word line, one unit offset in an upward direction is a base address N+1 of a second victim word line. When the cumulative number of accesses of the physical address corresponding to the base address N in the read/write phase is greater than the preset number of times, the refresh circuit may send the physical addresses corresponding to the base address N−1 and the base N+1 in the refresh phase to the memory array 16 for the memory array 16 to perform the refresh operation.

When the normal word line in the memory array 16 is damaged or is not enabled, the redundant word line instead of the damaged or non-enabled normal word line is employed for data storage. At this time, the memory array 16 performs read/write operation on the normal word line and the redundant word line, when the redundant word line is aggressed, the refresh circuit may send, before the refresh signal arrives, the physical address adjacent to the redundant word line to the memory array 16 for the memory array 16 to perform the refresh operation.

Figure 3:
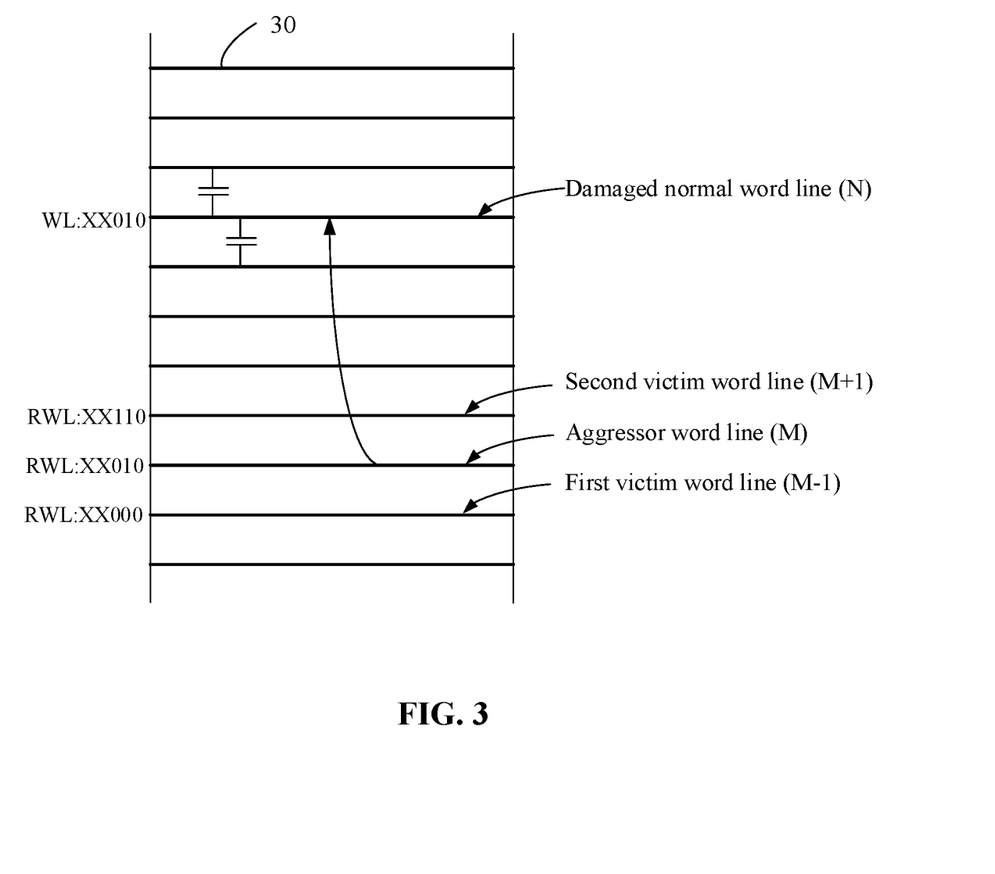
FIG. 3 is a second schematic diagram of word lines according to an embodiment of the present disclosure.

Referring to FIG. 3, multiple word line 30 are contained in the memory array, the normal word line whose base address is N and physical address is WL:XX010 is damaged, the redundant word line whose base address is M is employed for replacement to keep storing data.

In order to facilitate recognizing the correspondence between the redundant word line and the damaged normal word line, one flag bit R is typically added prior to the physical address of the damaged normal word line as the physical address of the redundant word line that replaces the damaged normal word line. For example, the physical address of the damaged normal word line is WL:XX010, the physical address of the redundant word line as a substitute is RWL:XX010. Since the physical address of the redundant word line is only related to the physical address of the damaged normal word line, there is no inevitable connection between the physical addresses of the adjacent redundant word lines, so the adjacent redundant word line cannot be positioned through the physical address of the redundant word line, the adjacent word line can only be positioned through the base address of the redundant word line.

Since the logical address has a correspondence with the physical address, the physical address has a correspondence with the base address, after the row address latch obtains the logical address whose cumulative number of accesses is greater than the preset number of times, the seed latch may output the base address of the aggressor word line according to the logical address of the aggressor word line. It is assumed that the seed address output by the seed latch is the base address M, the base address M corresponds to the physical address RWL:XX010, the row hammer refresh address further output by the logical arithmetic unit is: the logical address corresponding to the physical address RWL:XX000 that corresponds to the base address M−1, and the logical address corresponding to the physical address RWL:XX110 that corresponds to the base address M+1. After further decoded, the pre-decode unit outputs the physical address RWL:XX000 and the physical address RWL:XX110; the memory array performs the refresh operation on the word line (that is, the redundant word line whose base address is M+1 and the redundant word line whose base address is M−1) adjacent to the redundant word line whose base address is M according to the physical address RWL:XX000 and the physical address RWL:XX110, to prevent the row hammer effect from influencing data storage accuracy.

In the embodiment, the row hammer address and the row hammer flag signal may be output according to the input first logical address, and according to the input first logical address, the refresh sequence of the row hammer refresh address and the memory array are adjusted in real time so that the address adjacent to the word line that is frequently accessed are refreshed timely by the memory array to ensure data accuracy of the memory array.

Correspondingly, the embodiments of the disclosure further provide a memory, including any one of the refresh circuit as mentioned above In the embodiment, the memory may timely refresh the address adjacent to the word line frequently accessed to ensure data accuracy of the memory array in the memory.

One of ordinary skill in the art can understand that each embodiment is a specific embodiment implementing the disclosure, and in practical applications, various variations about the form and details can be made thereto without departing from the spirit and scope of the disclosure. Those skilled in the art may make respective alterations and modifications without departing from the spirit and scope of the present disclosure, so the protection scope of the disclosure is subject to the protection scope in claims.

What is claimed is:

1. A refresh circuit, comprising:
a signal selector, configured to select one of a normal word line logical address and a redundant word line logical address as an output, an output signal of which is designated as a first logical address;
a row address latch, connected to an output terminal of the signal selector and configured to output a row hammer address and a row hammer flag signal according to the first logical address;
a seed arithmetic unit, connected to an output terminal of the row address latch and configured to receive a refresh signal as an excitation signal and generate a seed address according to the row hammer address;
a logical arithmetic unit, connected to an output terminal of the seed arithmetic unit and configured to obtain a row hammer refresh address according to the seed address, wherein the row hammer refresh address is an adjacent physical address of the seed address; and
a pre-decode unit, connected to an output terminal of the logical arithmetic unit and configured to receive the row hammer refresh address, and convert the row hammer refresh address into a physical address to be used by a memory array of a memory to perform a refresh operation.

2. The refresh circuit of claim 1, wherein the signal selector comprises a first input terminal and a second input terminal, the first input terminal being configured to receive the normal word line logical address and the second input terminal being configured to receive the redundant word line logical address.

3. The refresh circuit of claim 2, wherein the signal selector further comprises a third input terminal for receiving a redundant flag signal, and the signal selector is further configured to enable one of the first input terminal and the second input terminal according to the redundant flag signal.

4. The refresh circuit of claim 3, further comprising a translator having an output terminal connected to the second input terminal, and configured to convert the physical address into the redundant word line logical address.

5. The refresh circuit of claim 4, wherein the pre-decode unit is further configured to receive the redundant word line logical address, and send the physical address corresponding to the redundant word line logical address to the translator and the memory array for the memory array to perform the refresh operation; and the refresh circuit further comprises a redundant module, configured to output the redundant flag signal after receiving the redundant word line logical address.

6. The refresh circuit of claim 1, wherein the pre-decode unit is further configured to receive the normal word line logical address and the redundant word line logical address, and convert the normal word line logical address and the redundant word line logical address into the physical addresses to be used by the memory array to perform the refresh operation.

7. The refresh circuit of claim 6, wherein the refresh circuit is configured to receive a read/write signal and the refresh signal in sequence, and the pre-decode unit is further configured to send the physical address to the memory array after the read/write signal is received.

8. The refresh circuit of claim 1, wherein the first logical address whose cumulative number of accesses is greater than a preset number of times is designated as the row hammer address, and the row address latch is configured to output the row hammer address and the row hammer flag signal after the row hammer address is obtained.

9. The refresh circuit of claim 8, wherein the row address latch is further configured to, after a plurality of first logical addresses each having a cumulative number of accesses greater than the preset number of times are obtained, determine the first logical address having a greatest cumulative number of accesses as the row hammer address.

10. A memory, comprising a memory array and a refresh circuit, wherein the circuit comprises:
a signal selector, configured to select one of a normal word line logical address and a redundant word line logical address as an output, an output signal of which is designated as a first logical address;
a row address latch, connected to an output terminal of the signal selector and configured to output a row hammer address and a row hammer flag signal according to the first logical address;
a seed arithmetic unit, connected to an output terminal of the row address latch and configured to receive a refresh signal as an excitation signal and generate a seed address according to the row hammer address;
a logical arithmetic unit, connected to an output terminal of the seed arithmetic unit and configured to obtain a row hammer refresh address according to the seed address, wherein the row hammer refresh address is an adjacent physical address of the seed address; and
a pre-decode unit, connected to an output terminal of the logical arithmetic unit and configured to receive the row hammer refresh address, and convert the row hammer refresh address into a physical address to be used by the memory array of the memory to perform a refresh operation.

11. The memory of claim 10, wherein the signal selector comprises a first input terminal and a second input terminal, the first input terminal being configured to receive the normal word line logical address and the second input terminal being configured to receive the redundant word line logical address.

12. The memory of claim 11, wherein the signal selector further comprises a third input terminal for receiving a redundant flag signal, and the signal selector is further configured to enable one of the first input terminal and the second input terminal according to the redundant flag signal.

13. The memory of claim 12, wherein the refresh circuit further comprises a translator having an output terminal connected to the second input terminal, and configured to convert the physical address into the redundant word line logical address.

14. The memory of claim 13, wherein the pre-decode unit is further configured to receive the redundant word line logical address, and send the physical address corresponding to the redundant word line logical address to the translator and the memory array for the memory array to perform the refresh operation; and the refresh circuit further comprises a redundant module, configured to output the redundant flag signal after receiving the redundant word line logical address.

15. The memory of claim 10, wherein the pre-decode unit is further configured to receive the normal word line logical address and the redundant word line logical address, and convert the normal word line logical address and the redundant word line logical address into the physical addresses to be used by the memory array to perform the refresh operation.

16. The memory of claim 15, wherein the refresh circuit is configured to receive a read/write signal and the refresh signal in sequence, and the pre-decode unit is further configured to send the physical address to the memory array after the read/write signal is received.

17. The memory of claim 10, wherein the first logical address whose cumulative number of accesses is greater than a preset number of times is designated as the row hammer address, and the row address latch is configured to output the row hammer address and the row hammer flag signal after the row hammer address is obtained.

18. The memory of claim 17, wherein the row address latch is further configured to, after a plurality of first logical addresses each having a cumulative number of accesses greater than the preset number of times are obtained, determine the first logical address having a greatest cumulative number of accesses as the row hammer address.

\* \* \* \* \*